US012805243B2

(12) United States Patent
Aderhold

(10) Patent No.: US 12,805,243 B2
(45) Date of Patent: Nov. 17, 2026

(54) RADIATION SEPARATION SYSTEM

(71) Applicant: Applied Materials, Inc., Santa Clara, CA (US)

(72) Inventor: Wolfgang R. Aderhold, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 697 days.

(21) Appl. No.: 18/123,090

(22) Filed: Mar. 17, 2023

(65) Prior Publication Data

US 2024/0312807 A1 Sep. 19, 2024

(51) Int. Cl.
*H10P 72/00* (2026.01)
*H10P 72/76* (2026.01)

(52) U.S. Cl.
CPC ...... *H10P 72/0436* (2026.01); *H10P 72/0602* (2026.01); *H10P 72/7612* (2026.01)

(58) Field of Classification Search
CPC ......... H01L 21/67115; H01L 21/67248; H01L 21/68742; H10P 72/0436; H10P 72/0602; H10P 72/7612
USPC .......................................................... 392/416
See application file for complete search history.

(56) References Cited

U.S. PATENT DOCUMENTS 6,221,166 B1 * 4/2001 Nguyen ................ C23C 16/481 118/725
7,398,014 B1 7/2008 Camm et al.
10,409,306 B2 9/2019 Ranish
11,057,963 B2 7/2021 Cong et al.
11,133,173 B2 9/2021 Ranish
2001/0035131 A1 * 11/2001 Sakuma ............ H01L 21/67115 118/724
2003/0190823 A1 * 10/2003 Keeton ............. H01L 21/67109 438/795
2013/0126515 A1 5/2013 Shero et al.
(Continued)

FOREIGN PATENT DOCUMENTS

CN 108475610 A 8/2018
KR 101574336 B1 12/2015
KR 10-2022-0132322 A 9/2022

OTHER PUBLICATIONS

International Search Report and Written Opinion dated Jun. 18, 2024 for Application No. PCT/US2024/016432.
(Continued)

*Primary Examiner* — Sang Y Paik
(74) *Attorney, Agent, or Firm* — Patterson + Sheridan, LLP

(57) ABSTRACT

The present disclosure generally relate to a lamp-heated apparatus for thermally processing a substrate. In particular, embodiments of the present disclosure relate to using a substrate and shield part to separate heating zones in a rapid thermal processing (RTP) chamber. In one implementation, a method of processing substrates includes placing a substrate into a processing chamber on a plurality of lift pins, lifting the substrate with the plurality of lift pins to a pre-heat position coplanar with a flange of a radiation shield, pre-heating the substrate in the pre-heat position with heat from a plurality of lamps, the plurality of lamps positioned above the substrate, lowering the substrate down to a substrate support with the lift pins after the pre-heating, processing the substrate on the substrate support, and removing the substrate from the processing chamber.

20 Claims, 5 Drawing Sheets

(56) References Cited

U.S. PATENT DOCUMENTS

| | | | | |
|---|---|---|---|---|
| 2015/0050819 | A1* | 2/2015 | Behdjat | H01L 21/324 427/230 |
| 2017/0328775 | A1 | 11/2017 | Aderhold | |
| 2020/0388517 | A1* | 12/2020 | Rohrmann | H01L 21/67109 |

OTHER PUBLICATIONS

Office Action from South Korean Patent Application No. 10-2025-7034601 dated Mar. 20, 2026.

* cited by examiner

RADIATION SEPARATION SYSTEM

BACKGROUND

Field

Embodiments of the present disclosure generally relate to a lamp-heated apparatus for thermally processing a substrate. In particular, embodiments of the present disclosure relate to using a substrate and shield part to separate heating zones in a rapid thermal processing (RTP) chamber.

Description of the Related Art

During rapid thermal processing of substrates, substrates are transferred into and out of the RTP chamber. Temperatures differences between the substrate entering the RTP chamber, and the RTP chamber itself, can result in thermal stress and uneven heating of the substrate.

Therefore, what is needed in the art is improved rapid thermal processing.

SUMMARY

The present disclosure generally relates to a lamp-heated apparatus for thermally processing a substrate. In particular, embodiments of the present disclosure relate to using a substrate and shield part to separate heating zones in a rapid thermal processing (RTP) chamber.

In one implementation, a method of processing substrates includes placing a substrate into a processing chamber on a plurality of lift pins, lifting the substrate with the plurality of lift pins to a pre-heat position coplanar with a flange of a radiation shield, preheating the substrate in the pre-heat position with heat from a plurality of lamps, the plurality of lamps positioned above the substrate, lowering the substrate down to a substrate support with the lift pins after the preheating, processing the substrate on the substrate support, and removing the substrate from the processing chamber.

In one implementation, a processing chamber applicable for use in semiconductor manufacturing includes a chamber body, a window disposed over the chamber body, a substrate support disposed in the chamber body, a plurality of lamps disposed above the window for directing thermal energy towards the substrate support, and a radiation shield disposed between the window and the substrate support, the radiation shield including a cylindrical main body comprising an opaque material, and a flange comprises an optically transparent material, the flange coupled to the cylindrical main body.

In one implementation, a radiation shield applicable for disposition in a processing chamber includes a cylindrical main body comprising an opaque material and a flange extending from a distal end of the cylindrical main body, the flange comprises a transparent material, the flange positon in a plane orthogonal to a central axis of the cylindrical main body.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to rapid thermal processing (RTP) chambers or other lamp heated thermal processing chambers, and more particularly, to shields used therein. It is to be understood that the term "about" used herein refers to a range of plus or minus 5% of the stated value.

Figure 1A:
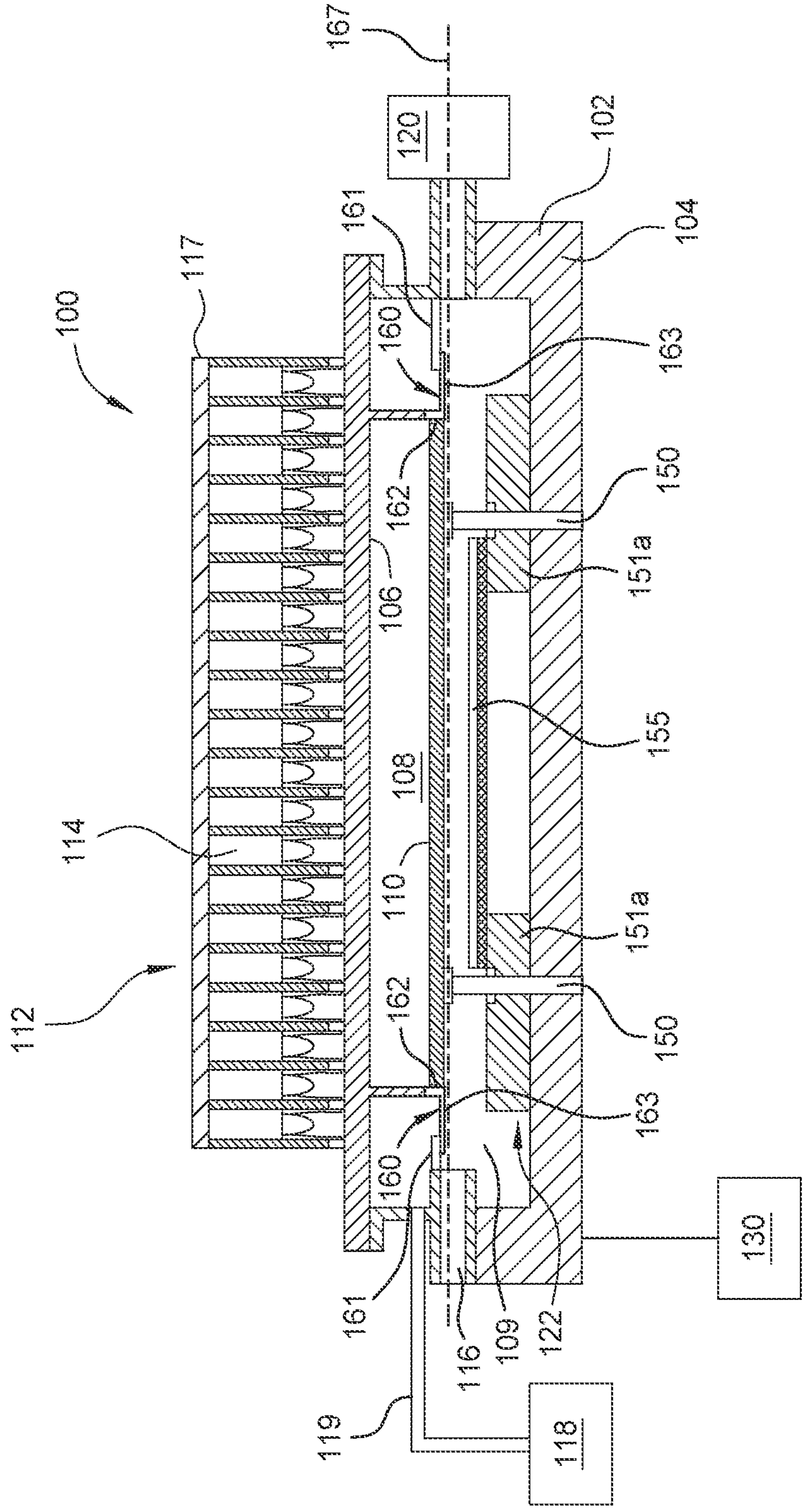
FIG. 1A is a schematic, cross-sectional view of a processing chamber with the substrate in a pre-heating position, according to embodiments of the disclosure.
Figure 1B:
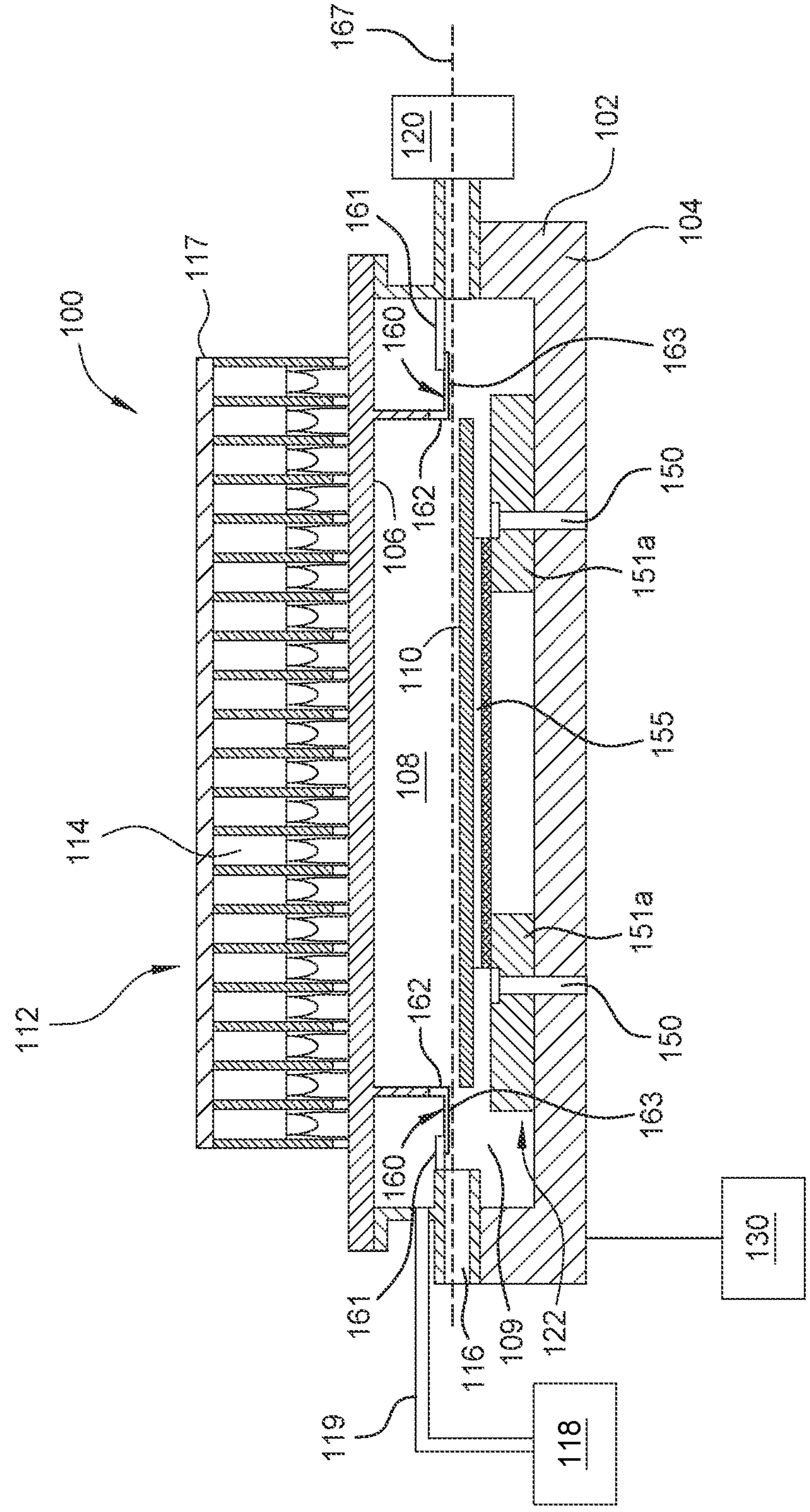
FIG. 1B is a schematic, cross-sectional view of the processing chamber with the substrate in a processing position, according to embodiments of the disclosure.

FIG. 1A and FIG. 1B are schematic, cross-sectional views of a processing chamber 100 according to embodiments of the disclosure. In some embodiments, the processing chamber 100 is an RTP chamber. In other embodiments, the processing chamber is any chamber applicable for use in semiconductor manufacturing. FIG. 1A illustrates the processing chamber 100 with a substrate 110 positioned in a pre-heating position, while FIG. 1B illustrates the processing chamber 100 with the substrate 110 positioned in a processing position. The processing chamber 100 includes sidewalls 102, a chamber bottom 104 coupled to the sidewalls 102, and a window 106 disposed over the sidewalls 102. In some embodiments, the window 106 is made of quartz. The sidewalls 102 and the chamber bottom 104 form a chamber body. The sidewalls 102, the chamber bottom 104, and the window 106 define an upper volume 108 for processing a substrate 110 therein and a lower volume 109. The upper volume 108 is fluidly coupled to the lower volume 109, and is generally delineated from the lower volume 109 by a plane defined by a lower or bottom edge of a radiation shield 160.

A slit valve door 116 is formed through the sidewalls 102 for transferring a substrate 110 therethrough. The processing chamber 100 is coupled to a gas source 118 by a conduit 119. The gas source 118 is configured to provide one or more processing gases to the upper volume 108 during processing. A vacuum pump 120 is coupled to the processing chamber 100 for pumping out the upper volume 108.

A substrate positioning assembly 122 is disposed in the lower volume 109 and configured to support, position, and/or rotate the substrate 110 during processing. The substrate positioning assembly 122 includes a substrate support 155, which may be a contact support such as a pedestal, or a non-contact substrate supporting device using flows of fluid to support, position, and/or rotate the substrate 110. The substrate positioning assembly 122 further includes edge supports 124 that support the edge of the substrate 110 when the substrate 110 is in the processing position. The substrate positioning assembly 122 facilitates support of the substrate 110 on the substrate support 155 and the edge supports 124 that are located in the lower volume 109 before processing (e.g., rapid thermal annealing) begins. The substrate positioning assembly 122 includes a plurality of lift pins 150 (two are shown) disposed in lift pin supports 151*a*. The lift pins 150 lifts the substrate 110 off the substrate support 155 to facilitate ingress san egress of the substrate 110 through the slit valve door 116, as well as to facilitate transition of the substrate 110 from the pre-heating position (raised from the substrate support 155) to the processing position (supported by the substrate support 155).

A heating assembly 112 is disposed above the window 106 and configured to direct thermal energy towards the upper volume 108 through the window 106. The heating assembly 112 includes a plurality of lamps 114, such as high voltage tungsten halogen lamps disposed in a hexagonal pattern and controllable in zones to provide controlled heating to different zones of the upper volume 108. Each of the plurality of lamps 114 is inserted into a heating assembly base 117 for electrical connection to a power supply (not shown).

A radiation shield 160 is coupled to the sidewalls 102 of the processing chamber 100 and secured thereto via one or more optional mounts 161. The radiation shield 160 includes a cylindrical main body 162 defining a central opening, and a flange 163 extending radially outward from a bottom edge of the cylindrical main body 162. The cylindrical main body 162 has an internal diameter greater than the substrate 110, such as that the substrate 110 can be received within the central opening defined by the main body, as illustrated in FIG. 1A. In some embodiments, the lateral clearance between the substrate 110 and the internal diameter of the cylindrical main body 162 is between 0.1 mm and 2 mm such as 0.3 mm and 1.1 mm such as about 1 mm. When the substrate 110 is flush with a bottom of radiation shield 160 (e.g., coplanar with the flange 163) the upper volume 108 is separated from the lower volume 109. In one example, the cylindrical main body 162 is in contact with the window 106.

FIG. 1A illustrates the substrate 110 in the pre-heat (e.g. upper) position in the processing chamber 100. In the pre-heat position, the substrate 110 is raised from and disposed above the substrate support 155 by the lift pins 150 off of the substrate support 155. The pre-heat position is above (e.g. at a greater elevation) both the processing positon of FIG. 1B and above a transfer position (i.e., the vertical height at which a substrate 110 is transferred into the processing chamber 100). The transfer height is denoted by plane 167. In the pre-heat position, the substrate 110 is coplanar with the flange 163 of the radiation shield 160. In this position, the lamps 114 of the heating assembly 112 pre-heat the substrate 110 while radiation from the lamps is blocked from directly heating the substrate support 155. For example, the flange 163 may be composed of a material which absorbs radiation from the lamps 114. Similarly, the substrate 110 may also be configured to absorb radiation from the lamps 114. Thus, when the substrate 110 is coplanar with the flange 163, radiation from the lamps 114 is substantially prohibited from directly radiating the substrate positioning assembly 122, and in particular, the substrate support 155 of the substrate positioning assembly 122. Thus, the temperature of the substrate 110 can be elevated with a reduced thermal effect on the substrate support 155. In some examples, the substrate 110 in the pre-heat position is located about 3 mm to about 50 mm from the window 106, such as about 5 mm to about 20 mm, such as about 5 mm to about 10 mm.

FIG. 1B shows the substrate 110 in the processing (e.g., lower) position in the processing chamber 100. In the processing position, the lift pins 150 are lowered and recessed into the lift pin supports 151*a* so that the substrate 110 is supported by the substrate support 155 and the edge supports 124. The processing positon is generally below the transfer height of the substrate 110 when transferred through the slit valve door 116. In the processing position, the substrate 110 is subject to a thermal treatment process, such as a rapid thermal anneal. During thermal treatment, radiant energy from the lamps 114 heats the substrate to a predetermined temperature. A controller 130, operably coupled to the processing chamber 100, controls one or more aspects of the thermal treatment process, as well movement of the substrate, including between transfer, pre-heat, and processing positions, in additional to other aspects of the processing chamber 100.

The controller 130 includes a central processing unit (CPU), a memory containing instructions, and support circuits for the CPU. The controller 130 controls various items directly, or via other computers and/or controllers. In one or more embodiments, the controller 130 is communicatively coupled to dedicated controllers, and the controller 130 functions as a central controller.

The controller 130 is of any form of a general-purpose computer processor that is used in an industrial setting for controlling various substrate processing chambers and equipment, and sub-processors thereon or therein. The memory, or non-transitory computer readable medium, is one or more of a readily available memory such as random access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)), read only memory (ROM), floppy disk, hard disk, flash drive, or any other form of digital storage, local or remote. The support circuits of the controller 130 are coupled to the CPU for supporting the CPU (a processor). The support circuits include cache, power supplies, clock circuits, input/output circuitry and subsystems, and the like. Operational parameters (such as a temperature of the substrate 110 and power applied to lamps 114) are stored in the memory as a software routine that is executed or invoked to turn the controller 130 into a specific purpose controller to control the operations of the various chambers/modules described herein. The controller 130 is configured to conduct any of the operations described herein. The instructions stored on the memory, when executed, cause one or more of operations of method 300 (described below) to be conducted.

Figure 1C:
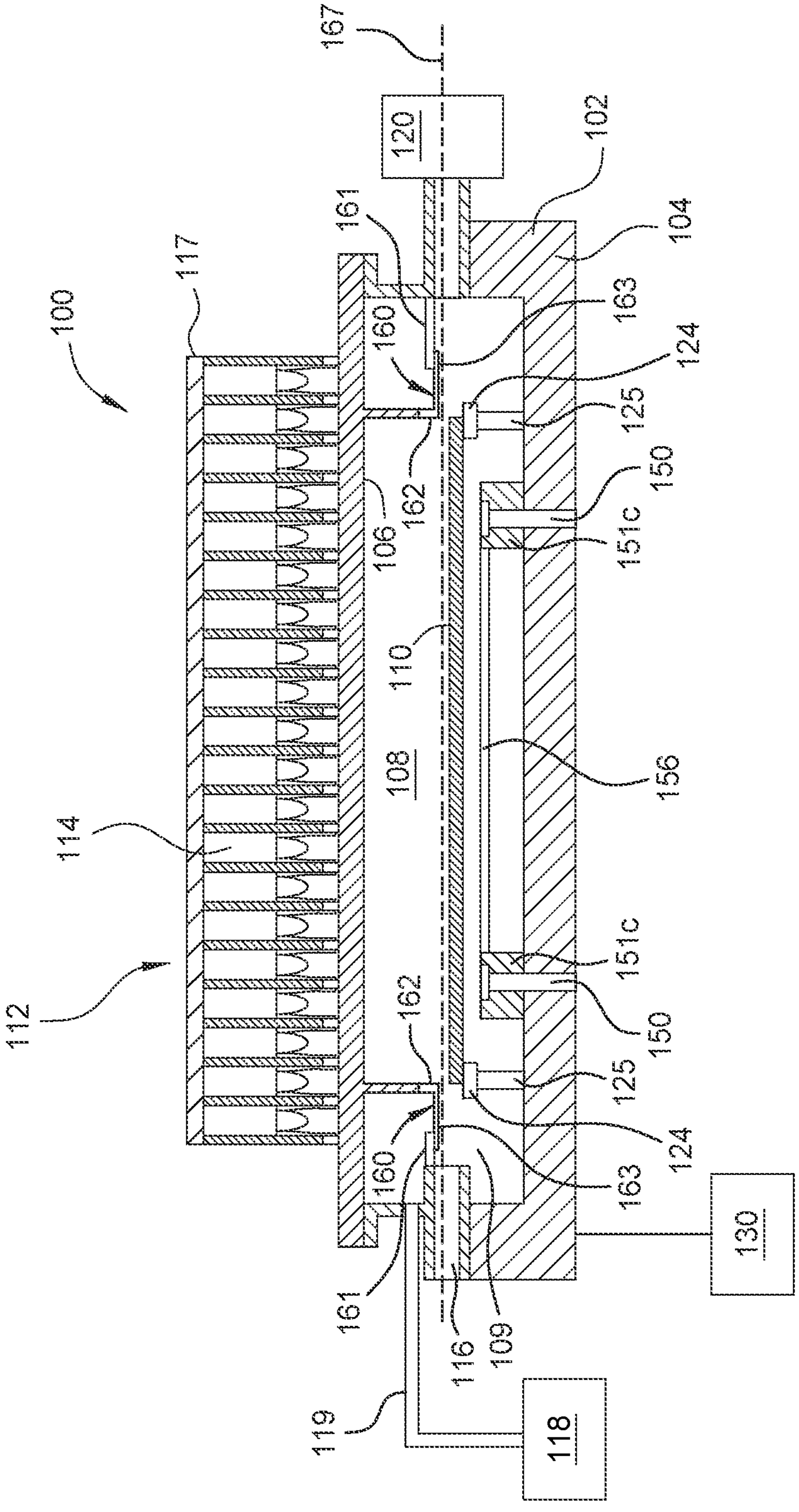
FIG. 1C is a schematic, cross-sectional view of the processing chamber with the substrate in a processing position, according to a different embodiment of the disclosure.

FIG. 1C is a schematic, cross-sectional view of the processing chamber with the substrate in a processing position, according to a different embodiment of the disclosure. FIG. 1C is similar to FIG. 1B, however, the substrate support 155 and the substrate positioning assembly 122 are replaced with an edge support 124. The edge support 124 is rotated by a rotation system 125. A reflector plate 156 is positioned beneath the substrate 110. The reflector plate 156 is attached to both lift pin supports 151*c*. The reflector plate 156 reflects radiation from the lamps 114.

Figure 2A:
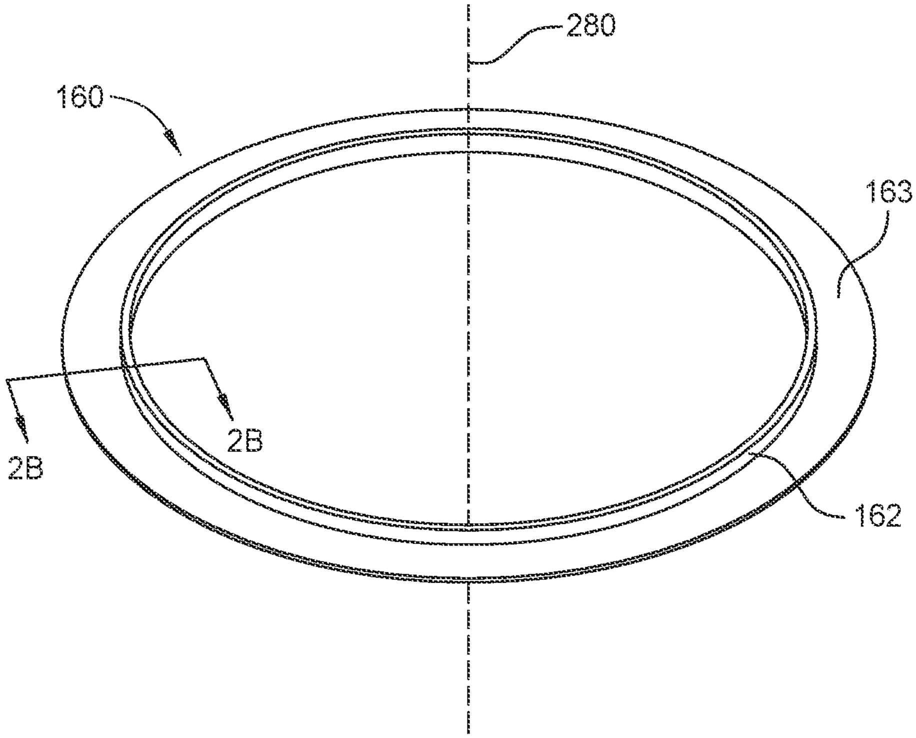
FIG. 2A is a schematic, isometric view of a radiation shield, according to embodiments of the disclosure.
Figure 2B:
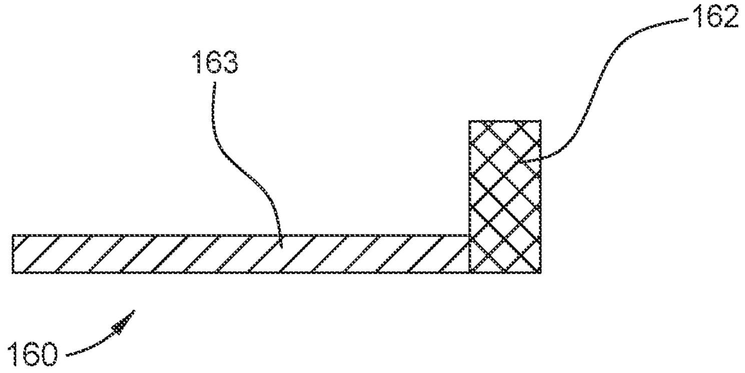
FIG. 2B is a cross-sectional view of the radiation shield along section line 2B-2B shown in FIG. 2A.

FIG. 2A is an isometric view of the radiation shield 160, according to embodiments of the disclosure. FIG. 2B is a cross-sectional view of the radiation shield 160 along section line 2B-2B shown in FIG. 2A. The radiation shield 160 includes the cylindrical main body 162 and the flange 163 disposed in a plane orthogonal to a central axis 280 of the cylindrical main body 162. The cylindrical main body 162 is made of opaque material, such as opaque quartz, black quartz, poly silicon, tungsten, titanium, or silicon carbide. The opacity of the cylindrical main body 162 reduces transmission of thermal radiation from lamps 114 (shown in FIGS. 1A and 1B) therethrough. The cylindrical main body 162 has an outer radius of between 180 mm and 200 mm such as between 185 mm and 195 mm such as about 190 mm to accommodate the plurality of lamps. The cylindrical main body 162 has an inner radius of between 140 mm and 160 mm such as between 145 mm and 155 mm such as about 150 mm to accommodate the substrate 110. The flange 163 is made of an optically transparent material, such as quartz, sapphire, and fused silica, and permits a majority or radiation from lamps 114 therethrough. The flange 163 has thickness between 1 mm and 5 mm such as between 2 mm and 4 mm such as about 3 mm. The cylindrical main body 162 is coupled to the flange 163. The flange 163 extends from a distal end of the cylindrical main body 162.

Figure 3:
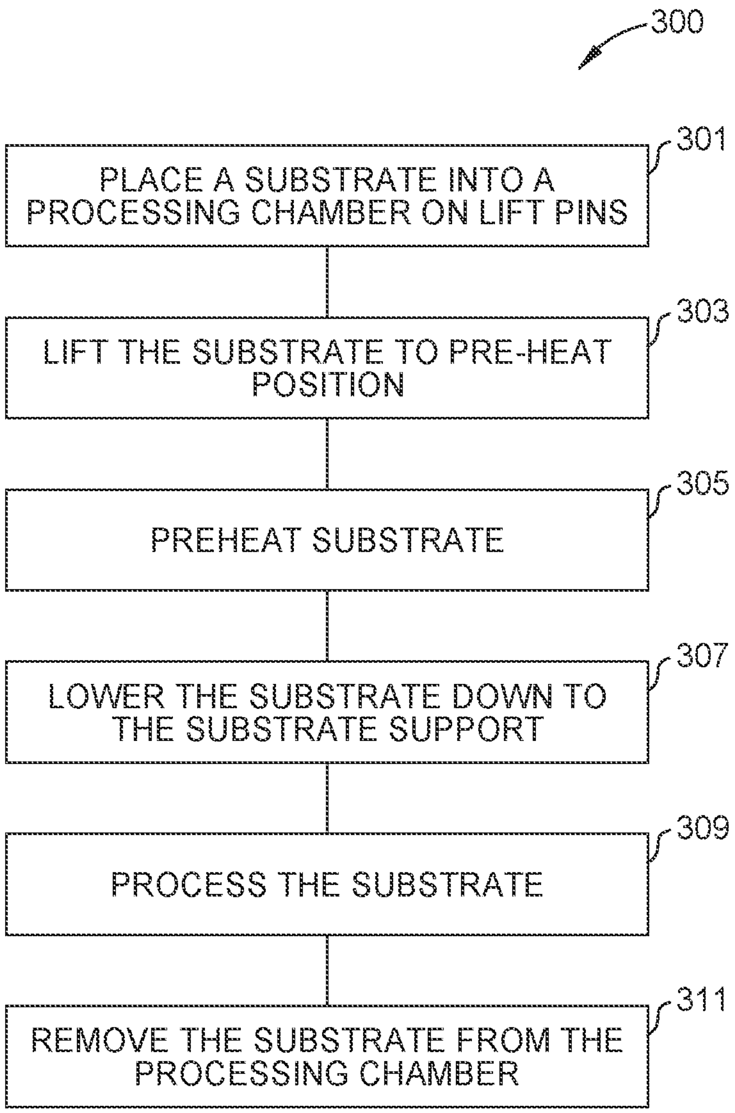
FIG. 3 is a schematic block diagram of a method of processing substrates, according to one embodiment.

FIG. 3 is a schematic block diagram of a method 300 of processing substrates, according to one implementation. FIG. 3 is explained with reference to FIG. 1A and FIG. 1B to facilitate understanding, but it is contemplated that methods herein are applicable to other processing chambers besides processing chamber 100. At operation 301, the substrate 110 is placed into the processing chamber 100 on lift pins 150. The substrate is brought in to the chamber cold (e.g., at a temperature less than the internal volume of the processing chamber, including the substrate support 155).

At operation 303, the substrate 110 is raised by lift pins 150. The lift pins 150 lift the substrate 110 to a pre-heat position coplanar with the flange 163 of the radiation shield 160. This separates the processing chamber 100 into an upper volume 108 and a lower volume 109. The substrate is pre-heated prior to coming in contact with the substrate support 155.

At operation 305, the substrate 110 is pre-heated. During pre-heating, the lamps 114 irradiate the substrate 110 to raise the temperature of the substrate 110 to a pre-heat temperature. The pre-heat temperature is between 290° C. and 310° C. such as between 295° C. and 305° C. such as about 300° C. The pre-heating takes between 10 s and 20 s. The substrate 110 is heated at a rate of about 30° C./s. The radiation emitted by the lamps is prevented from reaching the substrate support 155 due to the substrate and radiation shield 160 blocking the radiation from reaching the lower volume and the substrate support 155. Thus, a temperature increase of the substrate support is minimized. The substrate support 155 is substantially prevented from heating during the pre-heating.

The radiation shield 160 includes the cylindrical main body 162 formed from an opaque material. The opaque material reduces thermal radiation from lamps located within the internal diameter of the radiation shield from traveling through the cylindrical main body to a location radially outward of the cylindrical main body (and into a lower part of the processing chamber). Thus, heat from the lamps 114 is directed to the substrate 110 rather than components of the processing chamber 100. A reduction in thermal radiation to chamber components during the pre-heat operation improves subsequent thermal processing due to improved temperature control and uniformity, as undesired or unintended temperature increases are reduced. In such an example, it is easier to maintain the processing temperature at a predetermined desired temperature, improving substrate-to-substrate uniformity. In such examples, it is contemplated that a controller may power off lamps located outside of the outer diameter of the cylindrical main body 162, to further reduce inadvertent heating of processing chamber components.

At operation 307, the substrate is lowered from the pre-heat position after pre-heating. The lift pins 150 lower the substrate down to the substrate support 155 to the processing position. Because of the pre-heat operation, the substrate 110 and the substrate support 155 have a reduced temperature differential therebetween. The temperature differential between the substrate 110 and the substrate support 155 is less than 50° C. The reduced temperature differential between the substrate 110 and the substrate support 155 reduces thermal shock to the substrate 110, and reduces undesired heat transfer between the substrate 110 (which is at an elevated temperature due to pre-heating) and the substrate support 155 (which is at an elevated temperature due to previous thermal processes which occurred in the processing chamber 100).

At operation 309, the substrate 110 is processed, for example, in a rapid thermal annealing operation. One or more process gases may be provided to the interior of the processing chamber, and one or more lamps 114 may be powered on to deliver thermal radiation to the substrate 110 to facilitate processing thereof. The substrate 110 is processed on the substrate support 155.

The presence of the radiation shield 160 does not substantially interfere with uniform processing of the substrate 110. Due to the relative height and thickness of the cylindrical main body 162, as well as the relative spacing of the substrate 110 from the lamps 114 and/or window 106, minimal radiation is blocked by the cylindrical main body 162. If any portion of the window 106 is blocked by the cylindrical main body 162, the field of illumination of adjacent (uncovered) lamps 114 compensates for blocked radiation. Moreover, since the flange 163 is generally transmissive to radiation from the lamps 114, the flange 163 does not substantially interfere with the thermal radiation from the lamps 114.

At operation 311, after processing of operation 309 is complete, the substrate 110 is removed off the substrate support 155 and out of the processing chamber 100. Due to the thermal process that occurred during operation 309, the substrate support 155 remains at an elevated temperature relative to an incoming substrate 110. The process above can be repeated on the incoming substrate 110 to reduce thermal shock to the incoming substrate 110.

Benefits of the present disclosure include creating a separation between radiation reaching the substrate support 155 to avoid the substrate support getting too hot. The substrate 110 is brought into the processing chamber 100 cold so if it comes into direct contact with a hot substrate support the substrate will be subject to heat stress and woop. If the substrate 110 is pre-heated, the substrate will be heated faster and with better uniformity including better edge uniformity. The radiation shield can also be used in different embodiments with the substrate 110 on the substrate support 155 to achieve different optical properties. The disclosure is retrofittable in existing RTP chambers and other chambers. The simple design allows for inexpensive implementation.

It is contemplated that one or more aspects disclosed herein may be combined. As an example, one or more aspects, features, components, operations and/or properties of the processing chamber 100, the substrate support 155, the substrate 110, the upper volume 108, the lower volume 109, the lift pins 150, the heating assembly 112, the lamps 114, the radiation shield 160, the cylindrical main body 162, the flange 163, and/or the method 300 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A method of processing substrates, comprising:

placing a substrate into a processing chamber on a plurality of lift pins;

lifting the substrate with the plurality of lift pins to a pre-heat position within a central opening defined by a cylindrical main body of a radiation shield, wherein, in the pre-heat position, the substrate is flush with a bottom of the radiation shield and coplanar with a flange extending radially outward from a bottom edge of the cylindrical main body, wherein the cylindrical main body extends upwardly from the flange;

pre-heating the substrate in the pre-heat position with heat from a plurality of lamps, the plurality of lamps positioned above the substrate;

lowering the substrate down to a substrate support with the plurality of lift pins after the pre-heating;

processing the substrate on the substrate support; and removing the substrate from the processing chamber.

2. The method of processing substrates of claim 1, wherein the pre-heat position is about 5 mm to about 20 mm from a window defining a processing volume of the processing chamber.

3. The method of processing substrates of claim 1, wherein the cylindrical main body comprises an opaque material, the cylindrical main body coupled to the flange, the flange positioned in a plane orthogonal to a central axis of the cylindrical main body, wherein the flange comprises an optically transparent material.

4. The method of processing substrates of claim 3, wherein the opaque material includes opaque quartz, black quartz, poly silicon, tungsten, titanium, or silicon carbide, and the optically transparent material includes quartz, sapphire, and fused silica.

5. The method of processing substrates of claim 1, wherein during lowering the substrate down to the substrate support, the substrate support and the substrate have a temperature differential of less than 50° C.

6. The method of processing substrates of claim 1, wherein the pre-heat position is at an elevation greater than a loading or unloading height of the substrate.

7. The method of processing substrates of claim 1, wherein the substrate is pre-heated prior to any contact with the substrate support within the processing chamber.

8. A processing chamber applicable for use in semiconductor manufacturing, comprising:

a chamber body;

a window disposed over the chamber body;

a substrate support disposed in the chamber body;

a plurality of lamps disposed above the window for directing thermal energy towards the substrate support; and a radiation shield disposed between the window and the substrate support, the radiation shield including a cylindrical main body comprising an opaque material, and a flange extending radially outward from a bottom edge of the cylindrical main body, the bottom edge defining a distal end of the cylindrical main body and the cylindrical main body extending upwardly from the flange, wherein the flange comprises an optically transparent material, the flange positioned in a plane orthogonal to a central axis of the cylindrical main body.

9. The processing chamber of claim 8, wherein the cylindrical main body comprises black quartz.

10. The processing chamber of claim 8, wherein the cylindrical main body comprises opaque quartz.

11. The processing chamber of claim 8, wherein the flange comprises transparent quartz.

12. The processing chamber of claim 8, further comprising a plurality of lift pins, the lift pins configured to position a substrate in at least three positions, wherein the at least three positions comprise:

a pre-heat position coplanar with the flange of the radiation shield;

a transfer position coplanar with a slit valve door formed in the chamber body; and a processing position atop the substrate support.

13. The processing chamber of claim 12, wherein the pre-heat position is above the transfer position and the processing position.

14. The processing chamber of claim 8, wherein the cylindrical main body has an outer radius of between 180 mm and 200 mm.

15. The processing chamber of claim 8, wherein the cylindrical main body has an inner radius of between 140 mm and 160 mm.

16. The processing chamber of claim 8, wherein the flange has a thickness of between 1 mm and 5 mm.

17. A radiation shield applicable for disposition in a processing chamber, comprising:

a cylindrical main body comprising an opaque material; and a flange extending radially outward from a bottom edge of the cylindrical main body, the bottom edge defining a distal end of the cylindrical main body and the cylindrical main body extending upwardly from the flange, wherein the flange comprises an optically transparent material, the flange positioned in a plane orthogonal to a central axis of the cylindrical main body.

18. The radiation shield of claim 17, wherein the opaque material of the cylindrical main body comprises opaque quartz, black quartz, poly silicon, tungsten, titanium, or silicon carbide.

19. The radiation shield of claim 17, wherein the optically transparent material of the flange comprises transparent quartz, sapphire, or fused silica.

20. The radiation shield of claim 17, wherein the cylindrical main body has an outer radius of between 180 mm and 200 mm and an inner radius of between 140 mm and 160 mm.

* * * * *